United States Patent [19]
Tsuji et al.

[11] Patent Number: 5,697,801
[45] Date of Patent: Dec. 16, 1997

[54] CONNECTOR TERMINAL INSPECTING DEVICE

[75] Inventors: Masanori Tsuji; Motohisa Kashiyama; Shizuo Suzuki, all of Shizuoka-ken, Japan

[73] Assignee: Yazaki Corporation, Tokyo, Japan

[21] Appl. No.: 383,521

[22] Filed: Feb. 3, 1995

[30] Foreign Application Priority Data

Feb. 4, 1994 [JP] Japan .................................. 6-012627

[51] Int. Cl.$^6$ .................................................. H01R 13/62
[52] U.S. Cl. ..................................... 439/310; 439/488
[58] Field of Search .............................. 439/310, 296, 439/259, 261, 342, 372, 482, 912, 488, 489, 324; 324/158 F, 538

[56] References Cited

U.S. PATENT DOCUMENTS 5,429,519  7/1995  Murakami et al. ................ 439/310

FOREIGN PATENT DOCUMENTS

| 0140160 | 7/1985 | Japan . |
| 62-47093 | 12/1987 | Japan . |
| 64-27668 | 2/1989 | Japan . |
| 0025383 | 1/1990 | Japan . |

Primary Examiner—Hien Vu
Attorney, Agent, or Firm—Wigman, Cohen, Leitner & Myers, P.C.

[57] ABSTRACT

In a connector terminal inspecting device for inspecting conduction of terminals (79) of a connector (39) having a housing (45) formed with a hood portion (41), which comprises: a connector reception member (29) for supporting the housing (45) of the connector (39) to be tested; and an inspection member (31) disposed movably toward and away from the connector reception member and having a plurality of conduction inspecting pins (67), in particular, the inspection member (31) is formed with a plurality of pin accommodating chambers (65) for accommodating the conduction inspecting pins (67) and further with an engaged inspection portion (63) engaged with the hood (41) of the connector (39) to be tested. A plurality of the conduction inspecting pins (67) accommodated in the pin accommodating chambers (65) are brought into contact with the connector terminals (79) inserted into the pin accommodating chambers (65) from the connector reception member (29) side to the inspection member (31) side, respectively to inspect conduction of the connector terminals (79) of the connector (39). Since the conduction inspecting pins (67) can be protected by the engaged inspection portion (63), it is possible to bring the conduction inspecting pins securely into contact with the connector terminals to be tested.

11 Claims, 3 Drawing Sheets

CONNECTOR TERMINAL INSPECTING DEVICE

BACKGROUND OF THE INVENTION

1. Technical Field

The present invention relates to a connector terminal inspecting device for inspecting conduction of terminals arranged in a connector housing, and more specifically to a connector terminal inspecting device suitable for inspecting the conduction of terminals arranged in a connector housing formed with a hood portion.

2. Description of the Related Art

A connector terminal inspecting device is disclosed in Japanese Published Unexamined (Kokai) Patent Application No. 2-5888, for instance, by which conduction of terminals accommodated in a terminal accommodating chamber of a male connector can be inspected. In this related art connector terminal inspecting device, a connector reception member for supporting a male connector is disposed on one end of an L-shaped base board, and an inspection body member is disposed on the other end of the L-shaped base board. The inspection body member can be moved close to and away from the connector reception member under guidance by a guide shaft, when a cam lever is pivoted. Further, the inspection body member is formed with an engaged recessed portion engageable with a male connector to be inspected on the side facing the connector reception member, and a plurality of conduction inspecting pins are arranged in the engaged recessed portion of the inspection body member.

To inspect the conduction of terminals arranged in a male connector with the use of the connector terminal inspecting device as described above, a male connector to be tested is fitted to the connector reception member, and then the cam lever is pivoted to move the inspection body member toward the connector reception member so that the male connector can be fitted into the engage recessed portion of the inspection body member. Under these conditions, the terminals accommodated in the male connector can be brought into contact with conduction inspection pins arranged in the engage recessed portion of the inspection body member, so that it is possible to inspect the terminal conduction of the male connector. After the conduction inspection, the cam lever is pivoted in opposite direction to move the inspection body member away from the connector reception member, and then the male connector can be removed from the engage recessed portion of the inspection body member.

In the related art connector terminal inspecting device as described above, however, since the conduction pins are exposed outside from the engage recessed portion of the inspection body member, there exists a problem in that the conduction inspection pins are subjected to be bent or broken when an external force is applied thereto inadvertently.

Further, when the connector terminals are inspected under the conditions that the conduction inspecting pins of the inspecting device have been bent or broken by an external force, since the connector terminals to be inspected cannot be brought into contact with the conduction inspecting pins securely, there exists another problem in that it has been impossible to inspect the terminal conduction accurately.

In addition, in the related art terminal inspecting device, when the respective terminals to be inspected project under such a condition as to be slightly offset from the normal direction of the connector housing, the end surfaces of the conduction inspecting pins cannot be brought securely into contact with the respective terminals of the connector to be inspected, with the result that it has been impossible to inspect the connector terminals under these conditions.

SUMMARY OF THE INVENTION

With these problems in mind, therefore, it is the object of the present invention to provide a connector terminal inspecting device for inspecting conduction of connector terminals arranged in a connector housing formed with a hood portion, by which the connector terminals to be inspected can be securely brought into contact with conduction inspection pins.

To achieve the above-mentioned object, the present invention provides a connector terminal inspecting device for inspecting conduction of terminals (79) of a connector (39) having a housing (45) formed with a hood portion (41), which comprises: a connector reception member (29) for supporting the housing (45) of the connector (39) to be tested; and an inspection member (31) disposed movably toward and away from said connector reception member, including: an inspection body block (32); an inspection plate (36) fixed to said inspection body block and formed with an engaged inspection portion (63) engaged with the hood (41) of the connector (39) to be tested; and a plurality of conduction inspecting pins (67) accommodated in pin accommodating chambers (65) formed passing through said inspection body block (32) and said inspection plate (36) and brought into contact with the connector terminals (79) inserted into the pin accommodating chambers (65) from said connector reception member (29) side to said inspection member (31) side, respectively to inspect conduction of the connector terminals (79) of the connector (39).

Further, it is preferable that a conical surface (69) is formed at each outer end surface portion of each of the pin accommodating chambers (65) formed in said engaged inspection portion (63) to guide each end of the terminals (79) of the connector (39) to be tested into the pin accommodating chambers (65), respectively for terminal conduction inspection.

Further, the connector terminal inspecting device comprises a plurality of urging means (71) each disposed in the pin accommodating chamber (65) formed in said inspection body block (32), for urging each of the conduction inspecting pins (67) toward the terminals (79) of the connector (39) to be tested for terminal conduction inspection. The urging means (71) are compression springs, respectively.

In the connector terminal inspecting device, only said connector reception member (29) and said inspection plate (36) formed with the engaged inspection portion (63) are exchanged with new ones, whenever the connector (39) to be tested is exchanged.

Further, the connector terminal inspecting device comprises a link mechanism (81, 83) for moving said inspection member (31) toward and away from said connector reception member (29), two guide rods (59, 61) for movably guiding said inspection member (31) toward said connector reception member (29), and a compression coil spring (61) for urging said inspection member (31) away from said connector reception member (29).

Further, the present invention provides a connector terminal inspecting device for inspecting conduction of terminals (79) of a connector (39) having a housing (45) formed with a hood portion (41), having: a connector reception member (29) for supporting the housing (45) of the connector (39) to be tested; and an inspection member (31) disposed movably toward and away from the connector reception member and having a plurality of conduction inspection pins (67), wherein the inspection member (31) is formed with a plurality of pin accommodating chambers (65) for accommodating the conduction inspecting pins (67) and with an engaged inspection portion (63) engaged with the hood (41) of the connector (39) to be tested, a plurality of the conduction inspecting pins (67) accommodated in the pin accommodating chambers (65) being brought into contact with the connector terminals (79) inserted into the pin accommodating chambers (65) from the connector reception member (29) side to the inspection member (31) side, respectively to inspect conduction of the connector terminals (79) of the connector (39).

In the connector terminal inspecting device according to the present invention, when the inspection member is moved toward a tested connector supported by the connector reception member, since the engaged inspection portion of the inspection member can be engaged with the hood portion of the connector housing, the connector terminals arranged in the hood portion of the tested connector can be inserted into the pin accommodating chambers formed in the inspection member so as to be brought into contact with the conduction inspecting pins. In this case, since the conduction inspecting pins are all accommodated in the pin accommodating chambers, it is possible to prevent external force from being applied to the conduction inspecting pins inadvertently. Since the conduction inspecting pins can be prevented from being bent or broken, the connector terminals to be inspected can be brought securely into contact with the conduction inspecting pins.

Further, since the conical surface is formed at each outer end surface of each of the pin accommodating chambers, even if the connector terminals to be inspected are slightly offset from the normal direction, it is possible to guide and bring the connector terminals securely along the conical surfaces and further into contact with the conduction inspecting pins.

Further, since the urging means (springs) are disposed in the pin accommodating chambers, respectively to urge the conduction inspecting pins toward the connector terminals, it is possible to obtain stable contact force between the conduction inspecting pins and the connector terminals in the terminal conduction inspection.

DETAILED DESCRIPTION OF THE EMBODIMENTS

An embodiment of the connector terminal inspecting device according to the present invention will be described hereinbelow with reference to the attached drawings.

Figure 1:
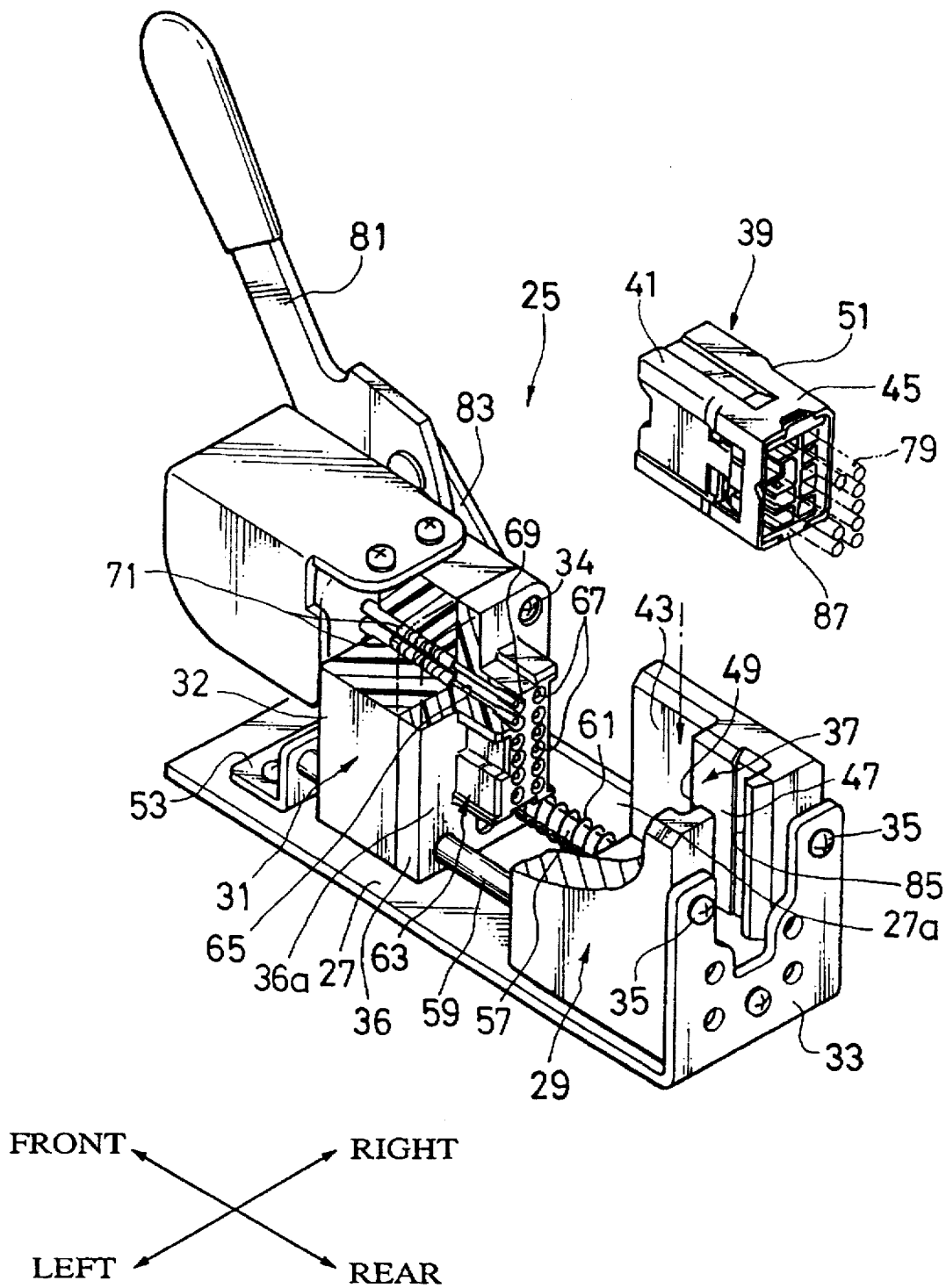
FIG. 1 is a perspective view showing an embodiment of the connector terminal inspecting device according to the present invention.

In FIG. 1, a connector terminal inspection device 25 is roughly composed of an L-shaped base board 27, a connector reception member 29 disposed on one (rear) side of the L-shaped base board 27, and an inspection member 31 disposed on the other (front) side of the same L-shaped base board 27. The inspection member 31 is so arranged as to be movable toward and away from the connector reception member 29. On the other hand, the connector reception member 29 is fixed to a vertical bent portion 38 of the flat base board 27 with screws 35.

With the use of the connector terminal inspecting device 25 as described above, the conduction of a plurality of terminals 79 of a female connector 39 can be inspected. The female connector 39 is composed of a plurality of connector terminals 79, a connector housing 45 formed with a hood portion 41, and a rear holder 87 for holding the terminals 79 in position within the connector housing 45.

The connector reception member 29 is formed with a connector engage groove 37 extending in the front and rear direction of the inspecting device 25 at roughly the middle portion of the same member 29. This connector engage groove 37 is formed with a hood engage portion 43 (with which the hood portion 41 of the female connector 39 is engaged) on the front side thereof, with a housing engage portion 47 (with which the housing 45 of the female connector 39 is engaged) on the rear side thereof, and with a rear holder contact portion 85 (with which the rear holder 87 of the female connector 39 is brought into contact). These hood engage portion 43 and the housing engage portion 47 are formed continuously with a stepped portion 49 interposed therebetween. When the female connector 39 is fitted to the terminal inspecting device 25, this stepped portion 49 is brought into contact with a stepped portion 51 formed between the hood portion 41 and the housing 45 of the female connector 39, and in addition the rear holder contact portion 85 is brought into contact with the rear holder 87 of the female connector 39.

On the other hand, the inspection member 31 is composed of an inspection body block 32 and an inspection plate 38 fixed to the inspection body block 32 with screws 34 on the rear side thereof. The inspection member 31 is supported by two guide rods 57 and 59 extending between an L-shaped support plate 53 fixed to the base board 27 and a vertical bent portion 33 of the base board 27 so as to be movable close to and away from the connector reception member 29. The two guide rods 57 and 59 are passed through the connector reception member 29 and fixed at both the L-shaped support plate 53 and the vertical bent portion 83 of the base board 27, respectively. Further, a compression spring 61 is interposed between the inspection plate 88 and the connector reception member 29 to urge the inspection member 31 away from the connector reception member 29.

The rear end surface of the inspection plate 88 is a connector contact portion 38a (with which an front end of the connector housing 45 of the female connector 39 to be tested is brought into contact). An engaged inspection portion 63 projects rearward from the central portion of this connector contact portion 36a in such a way as to be engaged with the hood portion 41 of the female connector 39 supported by the connector reception member 29. In other words, whenever the connector 39 to be inspected changes, the engaged inspection portion 63 is exchanged with a new one so that the external shape or size matches the hood portion 41 of the female connector 39.

Figure 2:
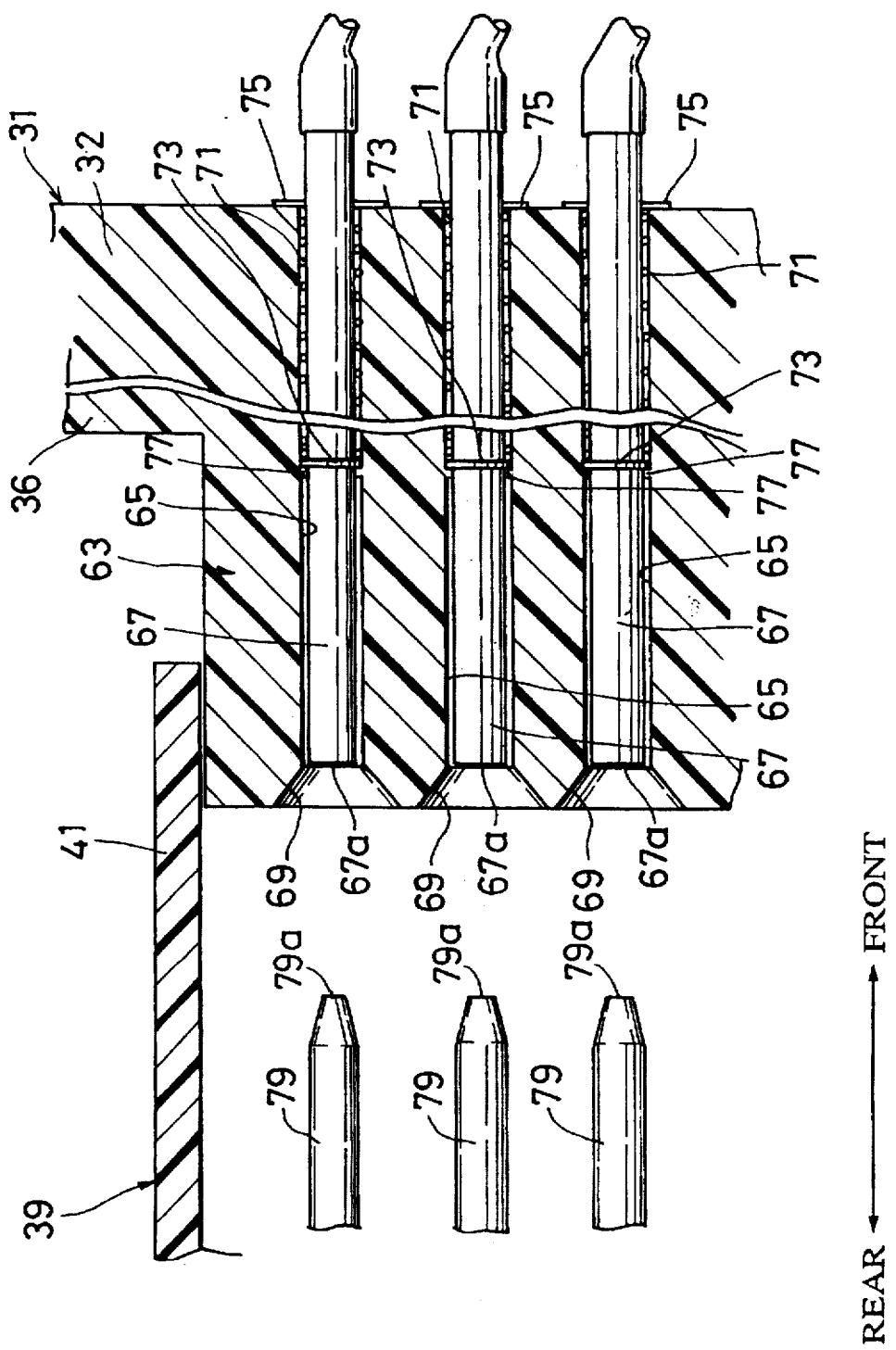
FIG. 2 is an enlarged cross-sectional view showing the disengagement relationship between the terminals of the connector formed with a hood portion and the conduction inspecting pins of the connector terminal inspecting device shown in FIG. 1.
Figure 3:
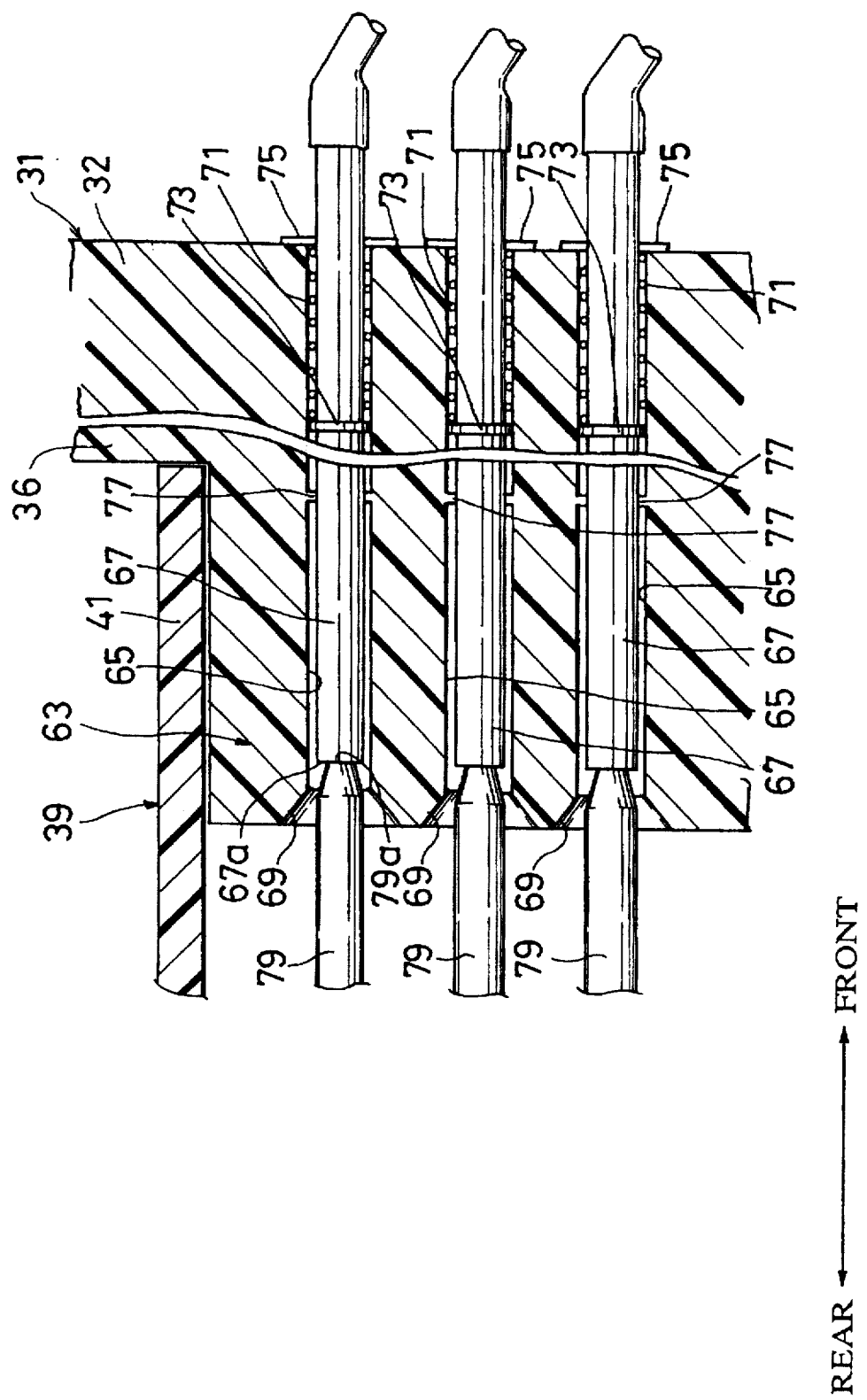
FIG. 3 is an enlarged cross-sectional view showing the engagement relationship between the terminals of the connector formed with a hood portion and the conduction inspecting pins of the connector terminal inspecting device shown in FIG. 1.

The engaged inspection portion 63 is formed with a plurality of pin accommodating chambers 65 in each of which a conduction inspecting pin 67 is accommodated. In more detail, with reference to FIG. 2, the outer opening end (rear or left side) of each of the pin accommodating chamber 65 is formed into a conical shape 69 whose diameter is increased gradually toward the connector reception member 29 (rear side). Further, each of the conduction inspecting pins 67 accommodated in each of the pin accommodating chambers 85 is urged by a compression spring 71, toward the female connector 39 to be tested. Each compression spring 71 is supported between an intermediate stopper 78 formed at the middle portion of the conduction inspecting pin 67 and anther stopper 75 fixed to each opening end of each pin accommodating chamber 65. In addition, the intermediate stopper 73 formed at the middle portion of the conduction inspecting pin 67 is in contact with a location stopper 77 formed so as to project from an inner wall of each of the pin accommodating chamber 65. Therefore, the conduction inspecting pin 67 is urged toward the connector reception member 29 (in the rearward direction) by the urging force of the compression spring 71 and further located at an appropriate position relative to the front end surface of the connector reception member 29 by the intermediate stopper 77, respectively. Further, the respective front ends of the conduction inspecting pins 67 are connected to wires connected to a conduction inspecting instrument (not shown), respectively, as shown in FIGS. 2 and 3.

In addition to the above-mentioned construction, a link mechanism is disposed on the front side of the inspection member 31. In more detail, an end of a link 83 is pivotally linked with one side of the inspection member 31 and the other end of this link 83 is pivotally linked with an operation lever 81. The operation lever 81 is pivotally linked with a side wall 27a formed by bending a right end side of the base board 27. Therefore, whenever the operation lever 81 is pivoted relative to the base board 27, it is possible to move the inspection member 31 toward or away from the connector reception member 29 via the link 83.

For inspection of the terminals 79 of the female connector 39 with the use of the connector terminal inspecting device 25 as described above, the female connector 39 is first inserted into the engage groove 37 of the connector reception member 29. After that, the operation lever 81 is pivoted to move the inspection member 31 toward the connector reception member 29. Then, the engaged inspection portion 63 is inserted into and engaged with the hood portion 41 of the female connector 39, so that the connector terminals 39 projectingly arranged within the hood portion 41 of the housing 45 are inserted into the respective pin accommodating chambers 45 of the inspection member 31. Under these conditions, when the inspection member 31 is further moved toward the connector reception member 29, ends 79a of the terminals 79 are brought into contact with end surfaces 67a of the conduction inspecting pins 67, and further move the conduction inspecting pins 67 in the rearward direction against the urging forces of the compression springs 71, respectively. Under these conditions, the conduction of the respective connector terminals 79 can be inspected with the use of the conduction inspection instrument (not shown).

In the above-mentioned insertion of the connector terminals 79 into the pin accommodating chambers 65 formed in the inspection body block 32 of the inspection member 31, even if the terminals 79 are not arranged accurately within the hood portion 41 of the connector housing 45 of the female connector 39 to be inspected (i.e., slightly inclined from the normal projection directions), since the ends 79a of the terminals 79 are inserted into the pin accommodating chambers 65 being guided along the conical portions 69 formed at the outer end surfaces of the inspection body block 32, it is possible to bring the connector terminals 79 securely into contact with the conduction inspecting pins 67.

Further, when the terminals 79 are not normally accommodated within the connector housing 45 of the female connector 39, the rear holder 87 of the female connector 39 cannot be fitted to the female connector 39 perfectly and thereby projects from the rear end of the connector housing 45 of the female connector 39. In this connector terminal inspecting device 25 according to the present invention, however, after the female connector 39 is inserted into the connector engage groove 37, when the operation lever 81 is pivoted to move the inspection member 31 toward the connector reception member 29, since the projecting inspection portion 63 can be inserted into the hood 41 of the female terminal 39 to be inspected, the conduction inspecting pins 67 can be brought into contact with the ends 79a of the connector terminals 79. When the engaged inspection portion 63 is further inserted into the hood 41 of the female terminal 39 to be inspected, since the front end of the hood portion 41 of the female connector 39 is brought into contact with the connector contact portion 36a of the inspection plate 38, the female connector 39 is further moved rearward, so that the rear holder 87 of the female connector 87 is brought into contact with the rear holder contact portion 85. Under these conditions, when the inspection member 31 is further moved, the rear holder 87 can be fitted into the housing 45 of the female connector 39 perfectly. Accordingly, it is possible to arrange the terminals 79 within the housing 45 of the female connector 39 under normal conditions.

After the conduction of the terminals 79 of the female connector 39 has been inspected, the operation lever 81 is pivoted in an opposite direction to move the inspection member 31 away from the connector reception member 29. Under these conditions, the end surfaces 67a of the conduction inspecting pins 67 are moved away from the ends 79a of the terminals 79, and further the engaged inspection portion 63 is removed from the hood 41 of the female connector 39.

In the connector terminal inspecting device 25 according to the present invention, since the conduction inspecting pins 67 are accommodated in the pin accommodating chambers 65, respectively without being exposed to the outside, it is possible to prevent an external force from being applied to the conduction inspecting pins 67 inadvertently; that is, to prevent the conduction inspecting pins from being bent or damaged by external force.

Further, since the conical surface portion 69 is formed at each end surface of each of the pin accommodation chambers 65, even if the connector terminals 79 of the female connector 39 to be tested are inclined slightly from the normal projection direction, it is possible to bring the terminals 79 to be inspected into contact with the conduction inspecting pins 67 securely, respectively under guidance of the conical surfaces portions 69.

Further, since the compression springs 71 are disposed to urge the conduction inspecting pins 67 against the connector terminals 79 of the female connector 39 to be tested, respectively, it is possible to bring the ends 79a of the connector terminals 79 into contact with the end surfaces 67a of the conduction inspecting pins 67 stably and securely under an appropriate contact pressure.

Further, when the conduction of terminals of another connector of different size or different hood is required to be tested, since only the connector reception member 29 and the inspection plate 36 formed with the engaged inspection portion 63 are replaced with new ones, it is possible to use in common the other remaining portions of the terminal inspecting device 25, with the result that it is possible to standardize the terminal inspecting device, while reducing the cost thereof.

Further, in the above-mentioned embodiment, although compression springs 71 are used as means for urging the conduction inspecting pins 67, without being limited to only the compression springs, it is of course possible to use different springs such as leaf springs, torsion coil springs, etc.

In the connector terminal inspecting device 25 according to the present invention, when the inspection member 31 is moved toward a tested connector supported by the connector reception member 29, since the engaged inspection portion 63 of the inspection member 31 can be engaged with the hood portion of the connector housing, the connector terminals arranged in the hood portion of the tested connector can be inserted into the pin accommodating chambers 65 formed in the inspection member 31 so as to be brought into contact with the conduction inspecting pins 67. In this case, since the conduction inspecting pins 67 are all accommodated in the pin accommodating chambers 65, it is possible to prevent external force from being applied to the conduction inspecting pins 87 inadvertently. Since the conduction inspecting pins 87 can be prevented from being bent or broken, the connector terminals to be inspected can be brought securely into contact with the conduction inspecting pins 67.

Further, since the conical surface 89 is formed at each outer end surface of each of the pin accommodating chambers 65, even if the connector terminals to be inspected are slightly offset from the normal direction, it is possible to guide and bring the connector terminals securely along the conical surfaces 69 and further into contact with the conduction inspecting pins 67, respectively.

Further, since the urging means (springs) 71 are disposed in the pin accommodating chambers 65, respectively to urge the conduction inspecting pins 67 toward the connector terminals, it is possible to obtain stable contact force between the conduction inspecting pins 67 and the connector terminals in the terminal conduction inspection.

What is claimed is:

1. A connector terminal inspecting device for inspecting conduction of terminals of a connector having a housing formed with a hood portion which comprises:

a connector reception member for supporting the housing of the connector to be tested; and an inspection member disposed movably toward and away from said connector reception member, including:

an inspection body block;

an inspection plate fixed to said inspection body block by fastening means and having a connector contact surface formed with an engaged inspection portion projecting outwardly therefrom toward the connector to be tested, said engaged inspection portion being narrower than said inspection plate so as to be fittingly received in the hood portion of the connector to be tested; and a plurality of pin accommodating chambers formed in the outwardly projecting engaged inspection portion and passing through said inspection body block and said inspection plate, a plurality of conduction inspection pins disposed in said pin accommodating chambers and brought into contact with the connector terminals inserted into the pin accommodating chambers from said connector reception member to said inspection member, respectively to inspect conduction of the connector terminals of the connector, whereby the conduction inspection pins are prevented from being bent or broken and can be brought securely into contact with the connector terminals.

2. The connector terminal inspecting device of claim 1, wherein said outwardly projecting engaged inspection portion has an outer end surface confronting the connector to be tested, the conduction inspection pins having free ends for contacting the connector terminals, the free ends of said pins being recessed from the outer end surface of the engaged inspection portion, a conical surface formed at the outer end surface around each of the pin accommodating chambers to guide a respective terminal of the connector to be tested into a respective pin accommodating chamber for terminal conduction inspection.

3. The connector terminal inspecting device of claim 1, further comprising urging means disposed in each pin accommodating chamber formed in said inspection body block for urging a respective conduction inspecting pin toward the respective terminal of the connector to be tested.

4. The connector terminal inspecting device of claim 3, wherein said urging means is a compression spring.

5. The connector terminal inspecting device of claim 1, wherein only said connector reception member and said inspection plate formed with the engaged inspection portion are exchanged with a different connector reception member and inspection plate whenever a different connector configuration is to be tested.

6. The connector terminal inspecting device of claim 1, further comprising a link mechanism for moving said inspection member toward and away from said connector reception member.

7. The connector terminal inspecting device of claim 1, further comprising two guide rods for movably guiding said inspection member toward said connector reception member.

8. The connector terminal inspecting device of claim 1, further comprising a compression coil spring for urging said inspection member away from said connector reception member.

9. The connector terminal inspecting device of claim 1, wherein the outwardly projecting engaged inspection portion is slidably engaged inside the hood of the connector when the inspection member is moved toward said connector to engage said hood against the connector contact surface.

10. The connector terminal inspecting device of claim 1, wherein said engaged inspection portion is formed as a substantially rectangular block extending outwardly from the connector contact surface, said rectangular block being formed with an outer end surface confronting the connector to be tested, the pin accommodating chambers being formed partly in said rectangular block, the conduction inspection pins in said pin accommodating chambers having free ends for contacting the connector terminals, said free ends being recessed inwardly from the outer end surface of the rectangular block.

11. A connector terminal inspecting device for inspecting conduction of terminals of a connector having a housing formed with a hood portion comprising:

a connector reception member for supporting the housing of the connector to be tested; and an inspection member disposed movably toward and away from the connector reception member and having a plurality of conduction inspection pins, said inspection member being formed with an outwardly projecting engaged inspection portion having an outer end surface, a plurality of pin accommodating chambers for accommodating the conduction inspecting pins being formed in the inspection member and outwardly projecting engaged inspection portion, conical surface portions being formed in said outer end surface about the pin accommodating chambers, said outwardly projecting engaged inspection portion being narrower than said inspection member so as to be fittingly received in the hood portion of the connector to be tested, the conduction inspecting pins being substantially completely enclosed in the pin accommodating chambers, said pins contacting the connector terminals inserted into the pin accommodating chambers from the connector reception member to the inspection member, respectively to inspect conduction of the connector terminals of the connector, whereby the conduction inspection pins are prevented from being bent or broken and can be brought securely into contact with the connector terminals.

* * * * *